US012609174B2

(12) United States Patent
    Hung

(10) Patent No.: US 12,609,174 B2
(45) Date of Patent: Apr. 21, 2026

(54) MEMORY DEVICE AND READ VOLTAGE SETTING METHOD THEREOF

(71) Applicant: MACRONIX International Co., Ltd., Hsinchu (TW)

(72) Inventor: Shuo-Nan Hung, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 106 days.

(21) Appl. No.: 18/761,321

(22) Filed: Jul. 2, 2024

(65) Prior Publication Data

US 2026/0011380 A1     Jan. 8, 2026

(51) Int. Cl.
    *G11C 16/34* (2006.01)

(52) U.S. Cl.
    CPC ................................. *G11C 16/3459* (2013.01)

(58) Field of Classification Search
    CPC ................................................ G11C 16/3459
    See application file for complete search history.

(56) References Cited

U.S. PATENT DOCUMENTS

| | | | |
|---|---|---|---|
| 8,902,651 B2 | 12/2014 | Kwak et al. | |
| 2012/0155181 A1* | 6/2012 | Hung | G11C 16/10 365/185.18 |
| 2013/0094294 A1 | 4/2013 | Kwak et al. | |
| 2013/0194883 A1* | 8/2013 | Lee | G11C 11/5642 365/201 |
| 2021/0065819 A1* | 3/2021 | Choi | G11C 29/42 |

FOREIGN PATENT DOCUMENTS

| | | |
|---|---|---|
| CN | 102982844 | 5/2016 |
| CN | 104616695 | 12/2017 |
| CN | 112447255 | 6/2024 |

* cited by examiner

*Primary Examiner* — Mohammed A Bashar
(74) *Attorney, Agent, or Firm* — J.C. PATENTS

(57)          ABSTRACT

A memory device and read voltage setting method are provided. The memory device may be a 3D NAND flash memory circuit, and provides a high-capacity storage medium with favorable performance. The read voltage setting method includes: performing read verify operations on multiple memory cells according to multiple first reading voltage intervals and obtaining multiple first pass memory cells numbers; shifting the respective first reading voltage intervals by a shift voltage value to obtain multiple second reading voltage intervals; determining whether there is at least one consecutive equal number or a minimum number of the pass cells numbers and setting a read voltage according to the at least one equal number or the minimum number.

20 Claims, 11 Drawing Sheets

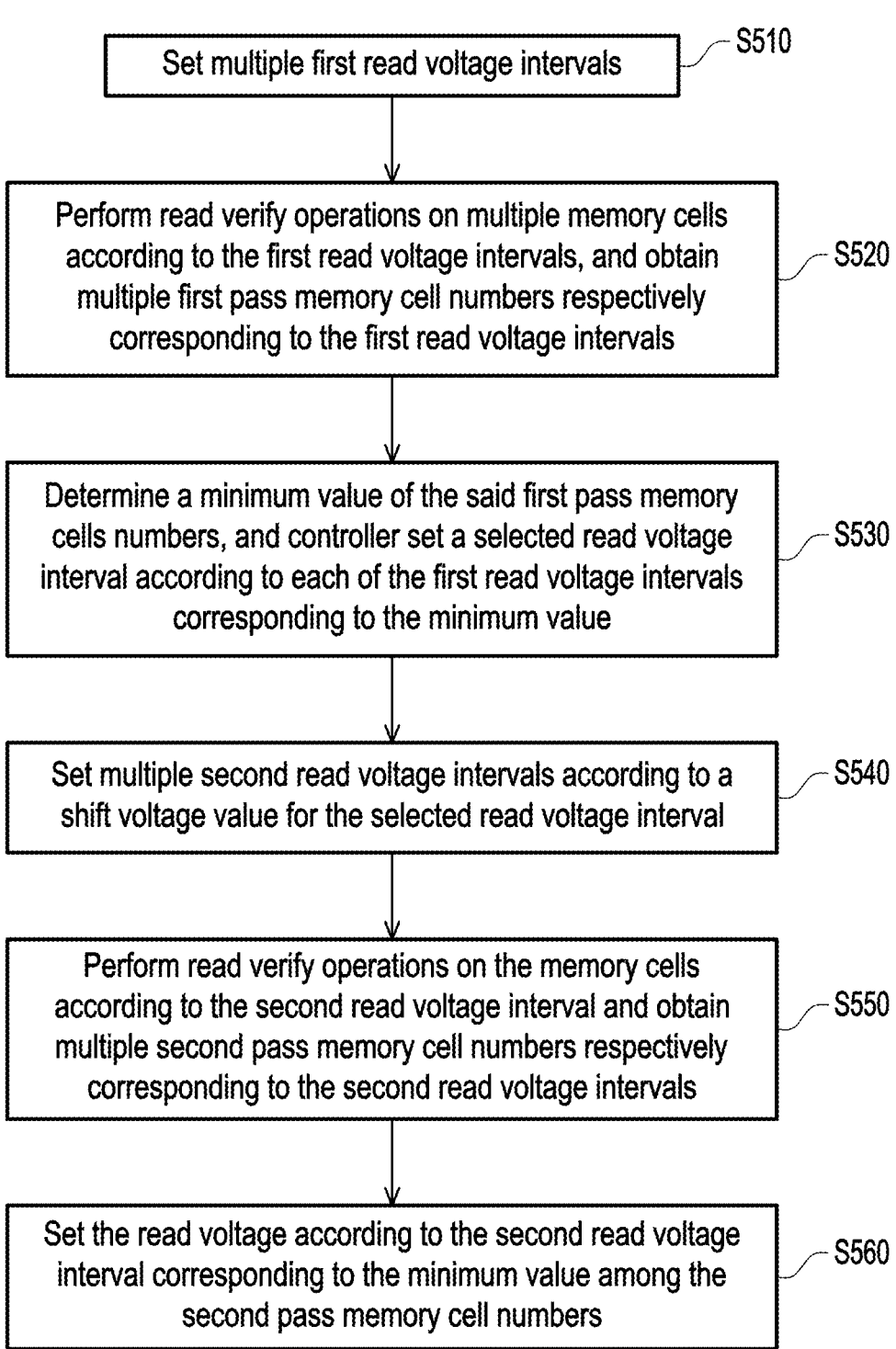

Set multiple first read voltage intervals ⎯ S510

Perform read verify operations on multiple memory cells according to the first read voltage intervals, and obtain multiple first pass memory cell numbers respectively corresponding to the first read voltage intervals ⎯ S520

Determine a minimum value of the said first pass memory cells numbers, and controller set a selected read voltage interval according to each of the first read voltage intervals corresponding to the minimum value ⎯ S530

Set multiple second read voltage intervals according to a shift voltage value for the selected read voltage interval ⎯ S540

Perform read verify operations on the memory cells according to the second read voltage interval and obtain multiple second pass memory cell numbers respectively corresponding to the second read voltage intervals ⎯ S550

Set the read voltage according to the second read voltage interval corresponding to the minimum value among the second pass memory cell numbers ⎯ S560

FIG. 5

MEMORY DEVICE AND READ VOLTAGE SETTING METHOD THEREOF

BACKGROUND

Technical Field

The disclosure relates to a memory device and a read voltage setting method thereof, and particularly relates to a memory device and a read voltage setting method capable of accurately determining a suitable read voltage.

Description of Related Art

In a memory device, when setting the read voltage of multi-level memory cells, it is necessary to look for the valley of a threshold voltage distribution of the memory cells. In the conventional technique, it is common to perform an operation to look for the valley of the threshold voltage distribution by setting a fixed voltage interval. With such technique, however, when the voltage interval is not set suitably, the pass memory cell number in each search operation may vary excessively, resulting a decreased accuracy in the setting of the read voltage. In addition, the read voltage determined under such condition may be rendered as a voltage value as the regional minimum value. As a result, data may be read erroneously.

SUMMARY

The disclosure provides a memory device and a read voltage setting method thereof capable of increasing the accuracy of the read voltage that is set.

A read voltage setting method according to an aspect of the disclosure includes: set a plurality of first read voltage intervals; perform read verify operations on a plurality of memory cells according to the first read voltage intervals, and obtain first pass memory cell numbers respectively corresponding to the first read voltage intervals; shift each of the first read voltage intervals by a shift voltage value to obtain a plurality of second read voltage intervals, wherein the shift voltage value is smaller than a width of the first read voltage interval; perform the read verify operations on the memory cells according to the second read voltage intervals, and obtain second pass memory cell numbers respectively corresponding to the second read voltage intervals; and determine whether there is at least one consecutive equal number, or a minimum value among the first pass memory cell numbers and the second pass memory cell numbers and set the read voltage according to each of the first read voltage intervals and each of the second read voltage intervals corresponding to at least one consecutive equal number or the minimum value.

A read voltage setting method according to another aspect of the disclosure includes: set a plurality of first read voltage intervals; perform read verify operations on a plurality of memory cells according to the first read voltage intervals, and obtain first pass memory cell numbers respectively corresponding to the first read voltage intervals; determine a minimum value among the first pass memory cell numbers, and setting a select read voltage interval according to each first read voltage interval corresponding to the minimum value; set a plurality of second read voltage intervals according to a shift voltage value for the selected read voltage interval; perform the read verify operations on the memory cells according to the second read voltage intervals, and obtain second pass memory cell numbers respectively corresponding to the second read voltage intervals; and set a read voltage according to the second read voltage interval corresponding to a minimum value among the second pass memory cell numbers.

A memory device according to an aspect of the disclosure includes a memory block, a sensing circuit, and a controller. The memory block has a plurality of memory cells. The sensing circuit is coupled to the memory cells and performs a data read operation on the memory cells. The controller is coupled to the sensing circuit and the memory block. The controller is configured to execute the read voltage setting method according to any of the above.

Based on the above, the memory device according to the disclosure performs a multi-stage valley search operation according to a memory cell threshold voltage distribution curve. The valley region of the memory cell threshold voltage distribution curve is accurately found and an accurate read voltage is set accordingly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5 is a flowchart illustrating a read voltage setting method according to another embodiment of the disclosure.

DESCRIPTION OF THE EMBODIMENTS

Figure 1:
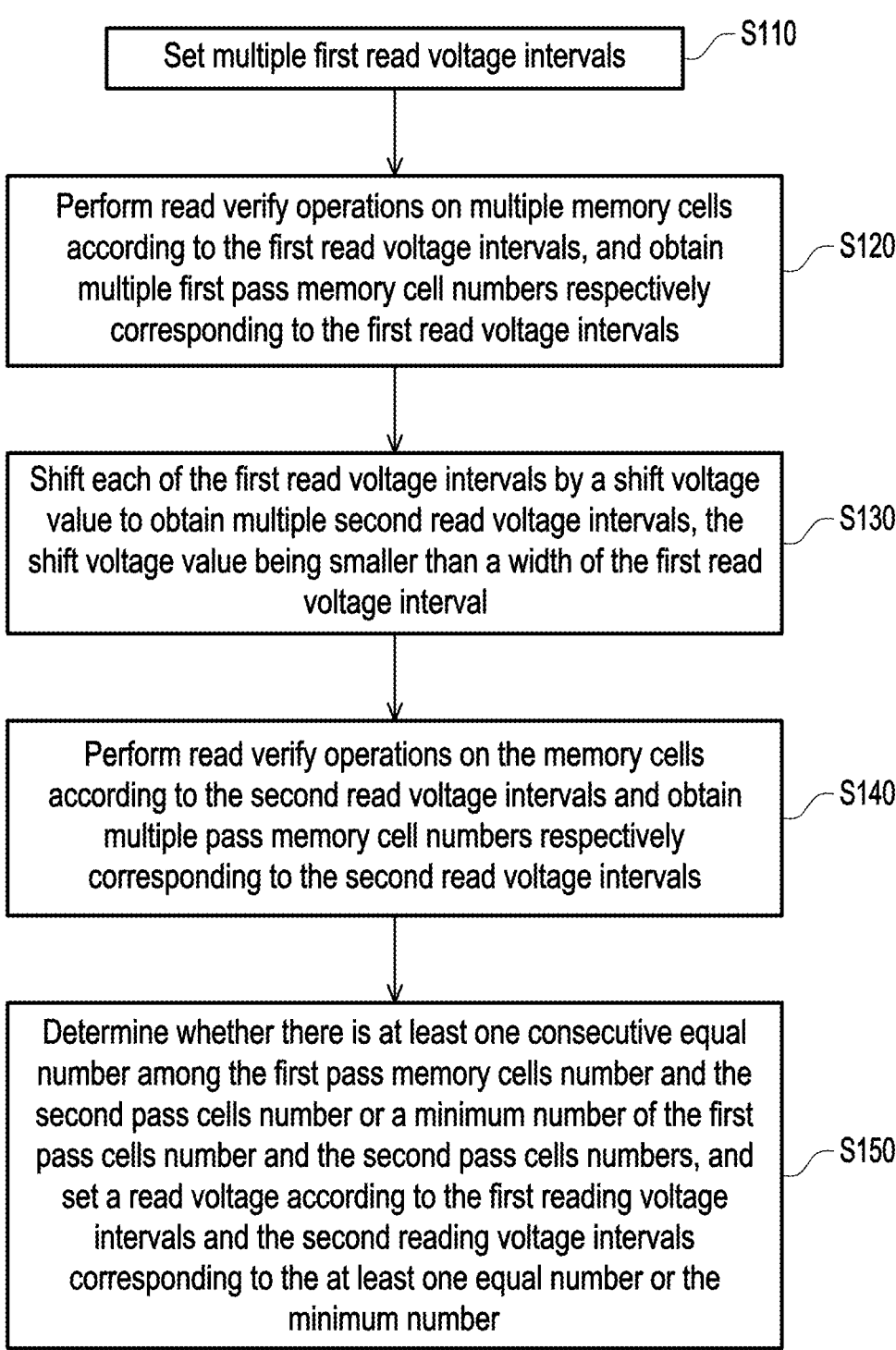
FIG. 1 is a flowchart illustrating a read voltage setting method according to an embodiment of the disclosure.

Referring to FIG. 1, FIG. 1 is a flowchart illustrating a read voltage setting method according to an embodiment of the disclosure. Specifically, the read voltage setting method is configured to perform an operation for looking for a valley position according to a threshold voltage distribution curve of multiple memory cells in a memory device, and perform a read voltage setting operation according to the valley region that is found. The memory device may be a non-volatile memory device, such as an NAND or NOR flash memory device. The read voltage setting method according to the embodiment may be performed by a controller in the memory device. In Step S110, the controller may set multiple first read voltage intervals in a threshold voltage range on which the search operation is to be performed. In the embodiment, the first read voltage intervals are consecutively distributed in the threshold voltage range to be searched.

In Step S120, the controller may be used with a sensing circuit in the memory device, perform read verify operations on memory cells according to the first read voltage intervals, and obtain multiple first pass memory cell numbers respectively corresponding to the first read voltage intervals through the read verify operations. Specifically, the read verify operation is configured to determine whether the threshold voltage of each memory cell falls within each first read voltage interval. In addition, the controller may obtain each corresponding first pass memory cell by counting the accumulative number of memory cells falling within each first read voltage interval.

Then, in Step S130, the controller may shift the first read voltage intervals by a shift voltage value, thereby generating multiple second read voltage intervals. Here, the shift voltage value may be smaller than the width of each first read voltage interval. Here, "width" refers to the difference between the upper limit voltage and the lower limit voltage in each first read voltage interval. In addition, the controller may perform read verify operations on the memory cells according to the second read voltage intervals, thereby obtaining multiple second pass memory cell numbers.

In Step S140, the controller may determine whether there is at least one consecutive equal number among the first pass memory cell numbers and the second pass memory cell numbers, or determine a minimum value among the first pass memory cell numbers and the second pass memory cell numbers, and set the read voltage according to the at least one consecutive equal number or the minimum value.

Figure 2A:
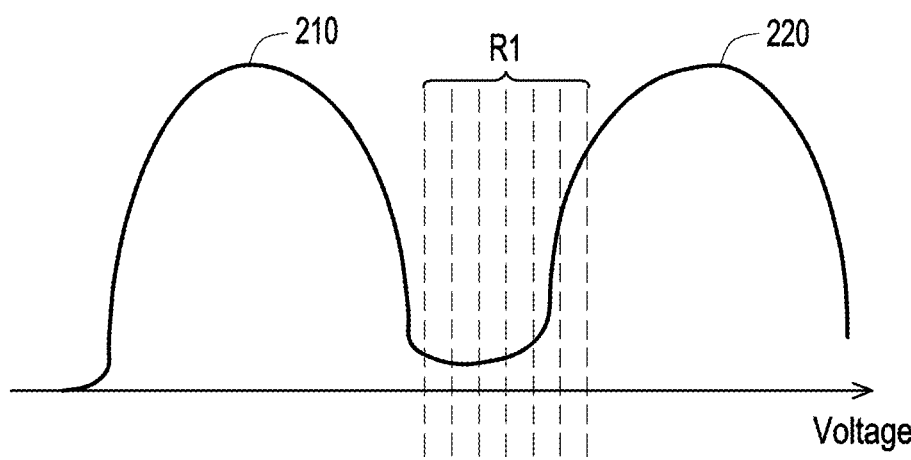
FIGS. 2A to 2C are schematic diagrams illustrating an operation of the read voltage setting method according to the embodiment of the disclosure.
Figure 2B:
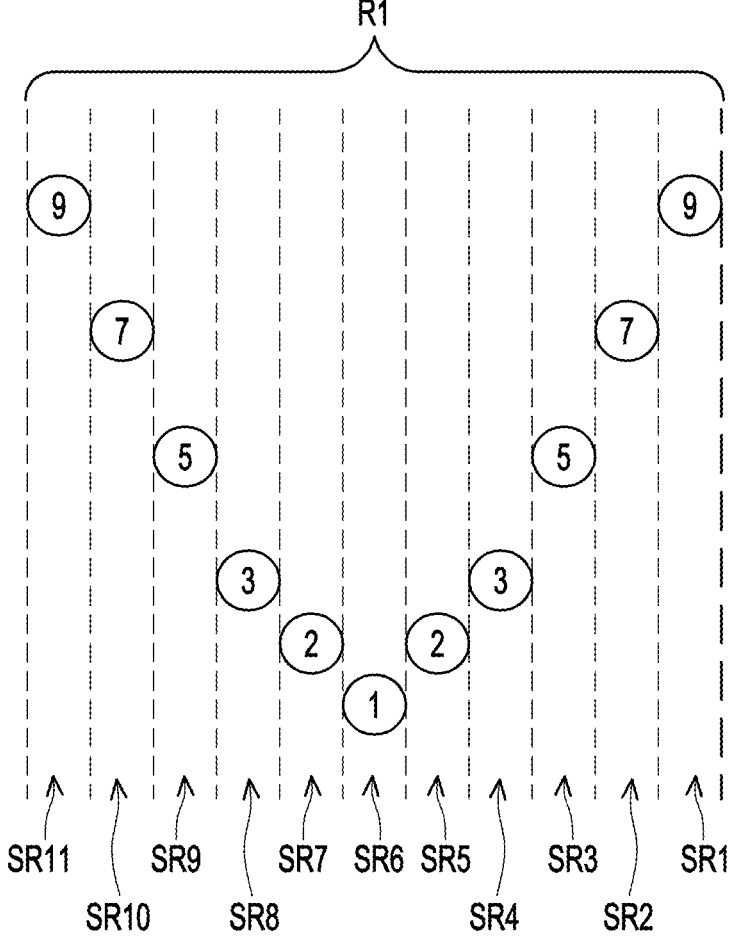
Figure 2C:
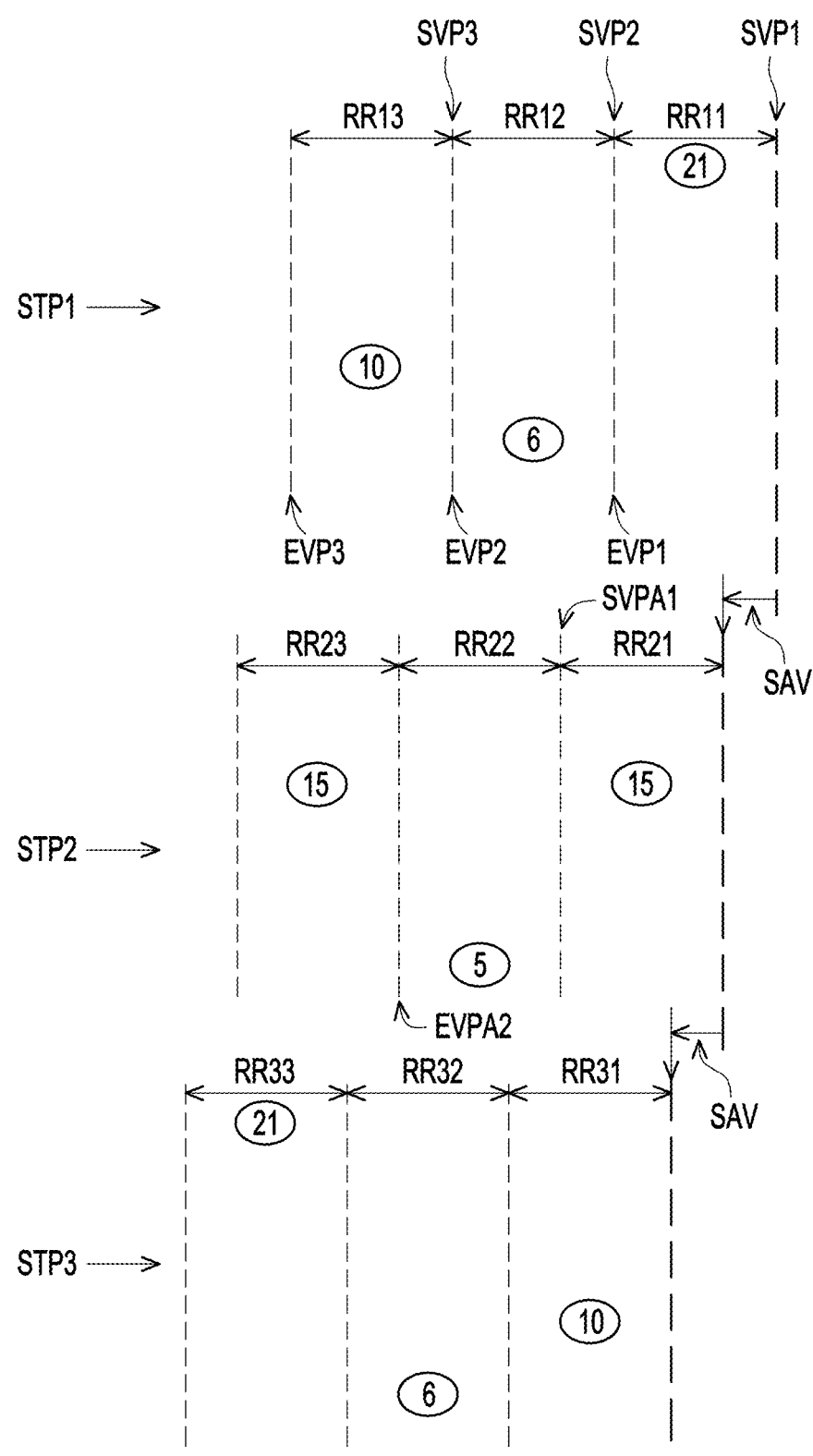

Referring to FIGS. 2A to 2C, FIGS. 2A to 2C are schematic diagrams illustrating an operation of the read voltage setting method according to the embodiment of the disclosure. The vertical axis of FIG. 2A represents the number of memory cells, and the horizontal axis of FIG. 2A represents the voltage. Partitioned curves 210, 220 are memory cell number-threshold voltage distribution curves respectively corresponding to different logic values. In the embodiment, the controller of the memory device may perform a search for a valley position between the partitioned curves 210, 220 according to a threshold voltage range R1 and perform a read voltage setting operation accordingly. The partitioned curves 210, 220 may be two of multiple memory cell distribution curves in a memory block. In the embodiments of the disclosure, the form of data storage of the memory cells in the memory block may be the form of single-level cell (SLC), multi-level cell (MLC), triple-level cell, or quad-level cell. The disclosure is not particularly limited in this regard.

In FIG. 2B, the threshold voltage range R1 may be divided into multiple sub-ranges SR1 to SR11. In the embodiment, the numbers of memory cells corresponding to the respective sub-ranges SR1 to SR11 are respectively 9, 7, 5, 3, 2, 1, 2, 3, 5, 7, 9. In the embodiment, the width of each of the sub-ranges SR1 to SR11 may be equal to one shift voltage value.

Regarding the execution of the read voltage setting operation, in FIG. 2C, in a first stage STP1, the controller may set multiple read voltage intervals RR11 to RR13 according to the threshold voltage range R1. The read voltage intervals RR11 to RR13 are arranged successively and consecutively. Specifically, regarding the setting of the read voltage intervals RR11 to RR13, the controller may firstly set a start read voltage SVP1, and then subtract a predetermined width of the read voltage interval from the start read voltage SVP1 to obtain an end read voltage EVP1. The read voltage interval RR11 is a voltage interval between the start read voltage SVP1 and the end read voltage EVP1.

Then, the controller may set another start read voltage SVP2 to be equal to the end read voltage EVP1, and then subtract the predetermined width of the read voltage interval from the start read voltage SVP2 to obtain another read voltage EVP2. The read voltage interval RR12 is a voltage interval between the start read voltage SVP2 and the end read voltage EVP2.

By analogy, the controller may set a start read voltage SVP3 and an end read voltage EVP3, and obtain the read voltage interval RR13 between a start read voltage SVP3 and an end read voltage EVP3.

In the embodiment, the predetermined width of the read voltage interval may be N times of the shift voltage value, N being an integer greater than 1. In other words, the width of each of the read voltage intervals RR11 to RR13 is greater than the width of each of the sub-ranges SR1 to SR11 shown in FIG. 2B.

In the first stage STP1, the controller may be used with the sensing circuit to perform the read verify operations on the memory cells and respectively obtain the pass memory cell numbers corresponding to the read voltage intervals RR11 to RR13. Specifically, the pass memory cell number of the read voltage interval RR11 may be 21, for example, the pass memory cell number of the read voltage interval RR12 may be 6, for example, and the pass memory cell number of the read voltage interval RR13 may be 10, for example. Among the numbers, the pass memory cell number (equal to 6) corresponding to the read voltage interval RR12 is the minimum value. Here, "pass memory cell number" refers to the number of memory cells whose threshold voltages fall within the corresponding read voltage intervals RR11 to RR13.

At the time of setting the read voltage according to the search result of the first stage STP1, the median of the read voltage interval RR12 may be set as the read voltage.

Then, in a second stage STP2, the controller may shift the read voltage intervals RR11 to RR13 by a shift voltage value SAV and correspondingly generate read voltage intervals RR21 to RR23. Then, the controller may be used with the sensing circuit to perform read verify operations on the memory cells according to the read voltage intervals RR21 to RR23.

In the second stage STP2, the controller may be used with the sensing circuit to perform the read verify operations on the memory cells and respectively obtain the pass memory cell numbers corresponding to the read voltage intervals RR21 to RR23. Specifically, the pass memory cell number of the read voltage interval RR21 may be 15, for example, the pass memory cell number of the read voltage interval RR22 may be 5, for example, and the pass memory cell number of the read voltage interval RR23 may be 10, for example. Among the numbers, the pass memory cell number (equal to 5) corresponding to the read voltage interval RR22 is the minimum value.

At the time of setting the read voltage according to the search result of the second stage STP2, the pass memory cell number (equal to 5) corresponding to the read voltage interval R22 is smaller than the minimum value (equal to 6) in the first stage STP1. Therefore, the controller may set the median of the read voltage interval RR22 as the read voltage.

Then, in a third stage STP3, the controller may shift the read voltage intervals RR21 to RR23 by the shift voltage value SAV and correspondingly generate read voltage intervals RR31 to RR33. Then, the controller may be used with the sensing circuit to perform read verify operations on the memory cells according to the read voltage intervals RR31 to RR33.

In the third stage STP3, the controller may be used with the sensing circuit to perform the read verify operations on the memory cells and respectively obtain the pass memory cell numbers corresponding to the read voltage intervals RR31 to RR33. Specifically, the pass memory cell number of the read voltage interval RR31 may be 10, for example, the pass memory cell number of the read voltage interval RR32 may be 6, for example, and the pass memory cell number of the read voltage interval RR33 may be 21, for example. Among the numbers, the pass memory cell number (equal to 6) corresponding to the read voltage interval RR32 is the minimum value.

Considering the valley search operations of the three stages STP1 to STP3 together, the controller may search and find that the minimum value (equal to 5) of the pass memory cell number corresponds to the read voltage interval RR22. More specifically, the controller may set the read voltage according to a start read voltage SVPA1 and an end read voltage EVPA1 of the read voltage interval RR22. For example, the controller may set the read voltage according to the median of the read voltage interval RR22, i.e., read voltage=(SVP1+EVP1)/2.

In the read voltage setting operation according to the disclosure, the number of stages in the operation for searching for the valley of the memory cell distribution may be adjusted dynamically. In some embodiments of the disclosure, after the search operation of the first stage STP1 is completed, the controller may directly set the read voltage according to the read voltage interval RR12 corresponding to the minimum value of the pass memory cell number in the first stage STP1, so that the read voltage is as follows: (SVP2+EVP2)/2. The controller may also perform a read test on the memory cells according to the read voltage that is set. If the result of the read test indicates correct, the subsequent second stage STP2 and third stage STP3 may be omitted. Alternatively, if the result of the read test indicates incorrect, the subsequent second stage STP2 is executed.

Likewise, after finishing the valley search operation of the second stage STP2, the controller may perform the read voltage setting operation according to the search results of the first stage STP1 and the second stage STP2. If the result of the read test performed on the memory cells according to the read voltage that is set indicates correct, the subsequent third stage STP3 may be omitted. Alternatively, if the result of the read test indicates incorrect, the subsequent third stage STP3 is executed.

Naturally, the three-stage operation for searching for the valley as shown in FIG. 2C merely serves as an example for describing the disclosure. In the embodiment, two, three or more than three search stages may be applied. The disclosure is not particularly limited in this regard.

Figure 3A:
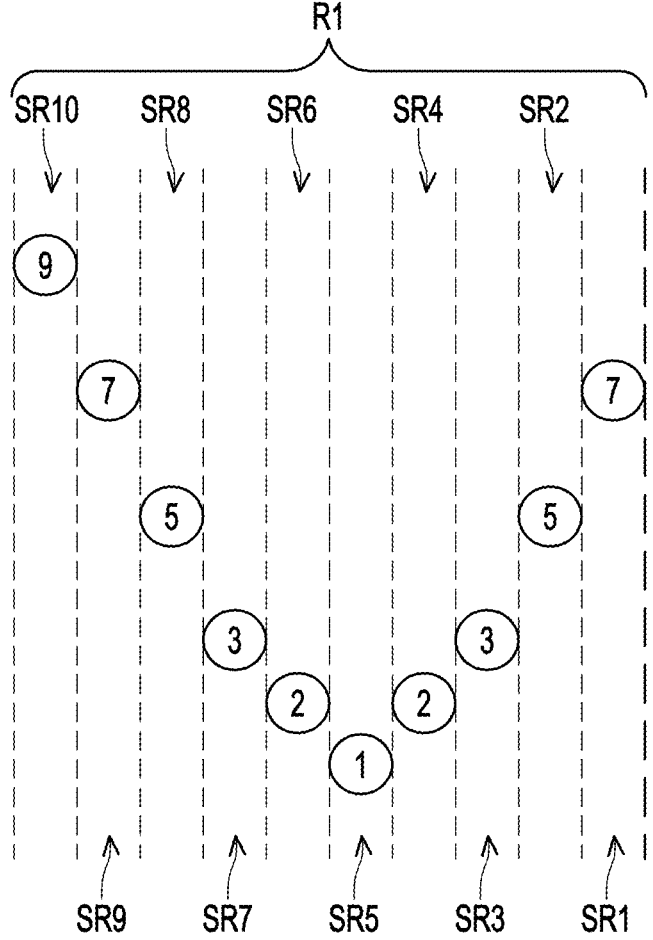
FIGS. 3A and 3B are schematic diagrams illustrating an operation of another example of the read voltage setting method according to an embodiment of the disclosure.
Figure 3B:
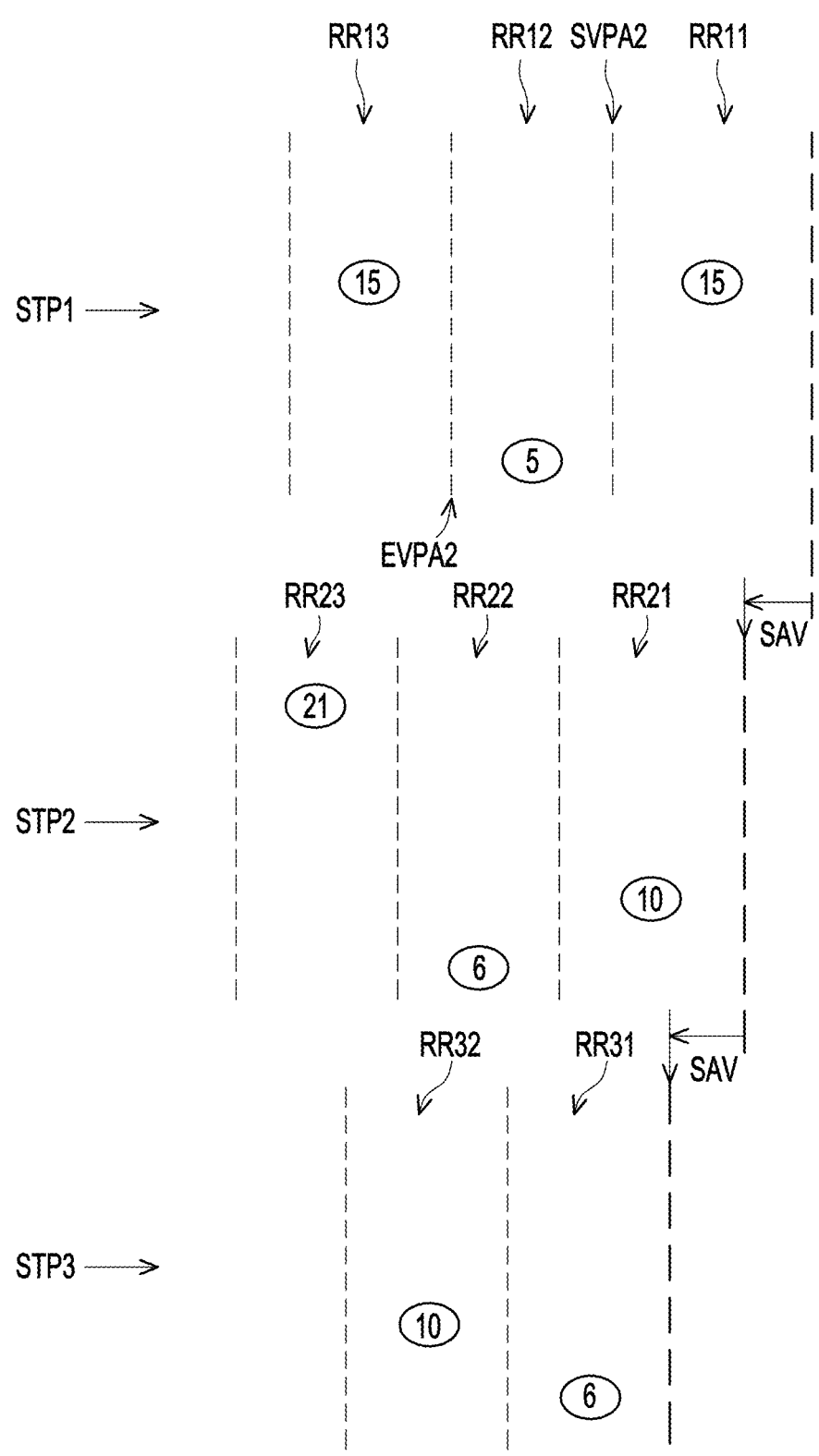

Referring to FIGS. 3A and 3B, FIGS. 3A and 3B are schematic diagrams illustrating an operation of another example of the read voltage setting method according to another embodiment of the disclosure. The vertical axis of FIG. 3A represents the number of memory cells, and the horizontal axis of FIG. 2A represents the voltage. In FIG. 3A, the threshold voltage range R1 may be partitioned into multiple sub-ranges SR1 to SR10. In the embodiment, the numbers of memory cells corresponding to the respective sub-ranges SR1 to SR10 are respectively 7, 5, 3, 2, 1, 2, 3, 5, 7, and 9. In the embodiment, the width of each of the sub-ranges SR1 to SR10 may be equal to one shift voltage value.

Regarding execution of the read voltage setting operation, in FIG. 3B, in the first stage STP1, the controller may set multiple read voltage intervals RR11 to RR13 according to the threshold voltage range R1. The read voltage intervals RR11 to RR13 are arranged successively and consecutively.

In the embodiment, the predetermined width of the read voltage interval may be N times of the shift voltage value, N being an integer greater than 1. In other words, the width of each of the read voltage intervals RR11 to RR13 is greater than the width of each of the sub-ranges SR1 to SR10 shown in FIG. 3B.

In the first stage STP1, the controller may be used with the sensing circuit to perform the read verify operations on the memory cells and respectively obtain the pass memory cell numbers corresponding to the read voltage intervals RR11 to RR13. Specifically, the pass memory cell number of the read voltage interval RR11 may be 15, for example, the pass memory cell number of the read voltage interval RR12 may be 5, for example, and the pass memory cell number of the read voltage interval RR13 may be 15, for example. Among the numbers, the pass memory cell number (equal to 5) corresponding to the read voltage interval RR12 is the minimum value.

At the time of setting the read voltage according to the search result of the first stage STP1, the median of the read voltage interval RR12 may be set as the read voltage.

Then, in the second stage STP2, the controller may shift the read voltage intervals RR11 to RR13 by the shift voltage value SAV and correspondingly generate the read voltage intervals RR21 to RR23. Then, the controller may be used with the sensing circuit to perform read verify operations on the memory cells according to the read voltage intervals RR21 to RR23.

In the second stage STP2, the controller may be used with the sensing circuit to perform the read verify operations on the memory cells and respectively obtain the pass memory cell numbers corresponding to the read voltage intervals RR21 to RR23. Specifically, the pass memory cell number of the read voltage interval RR21 may be 10, for example, the pass memory cell number of the read voltage interval RR22 may be 6, for example, and the pass memory cell number of the read voltage interval RR23 may be 21, for example. Among the numbers, the pass memory cell number (equal to 6) corresponding to the read voltage interval RR22 is the minimum value.

The minimum value (equal to 6) of the memory cell number in the second stage STP2 is greater than the minimum value (equal to 5) of the memory cell number in the first stage STP1. Therefore, the controller may maintain the setting of the read voltage completed in the first stage STP1.

Then, in the third stage STP3, the controller may shift the read voltage intervals RR21 to RR23 by the shift voltage value SAV and correspondingly generate read voltage intervals RR31 to RR33. Then, the controller may be used with the sensing circuit to perform read verify operations on the memory cells according to the read voltage intervals RR31 to RR33.

In the third stage STP3, the controller may be used with the sensing circuit to perform the read verify operations on the memory cells and respectively obtain the pass memory cell numbers corresponding to the read voltage intervals RR31 and RR32. Specifically, the pass memory cell number of the read voltage interval RR31 may be 6, for example, and the pass memory cell number of the read voltage interval RR32 may be 10, for example. Among the numbers, the pass memory cell number (equal to 6) corresponding to the read voltage interval RR31 is the minimum value.

Considering the valley search operations of the three stages STP1 to STP3 together, the controller may search and find that the minimum value (equal to 5) of the pass memory cell number corresponds to the read voltage interval RR12. More specifically, the controller may set the read voltage according to a start read voltage SVPA2 and an end read voltage EVPA2 of the read voltage interval RR12. For example, the controller may set the read voltage according to the median of the read voltage interval RR12, i.e., read voltage=(SVPA2+EVPA2)/2.

Also, the valley search operation of present embodiment can be stopped when a position of the valley has been searched. Therefore, in the search operation of the third stage STP3, only two read voltage intervals RR31, RR32 are provided.

Figure 4A:
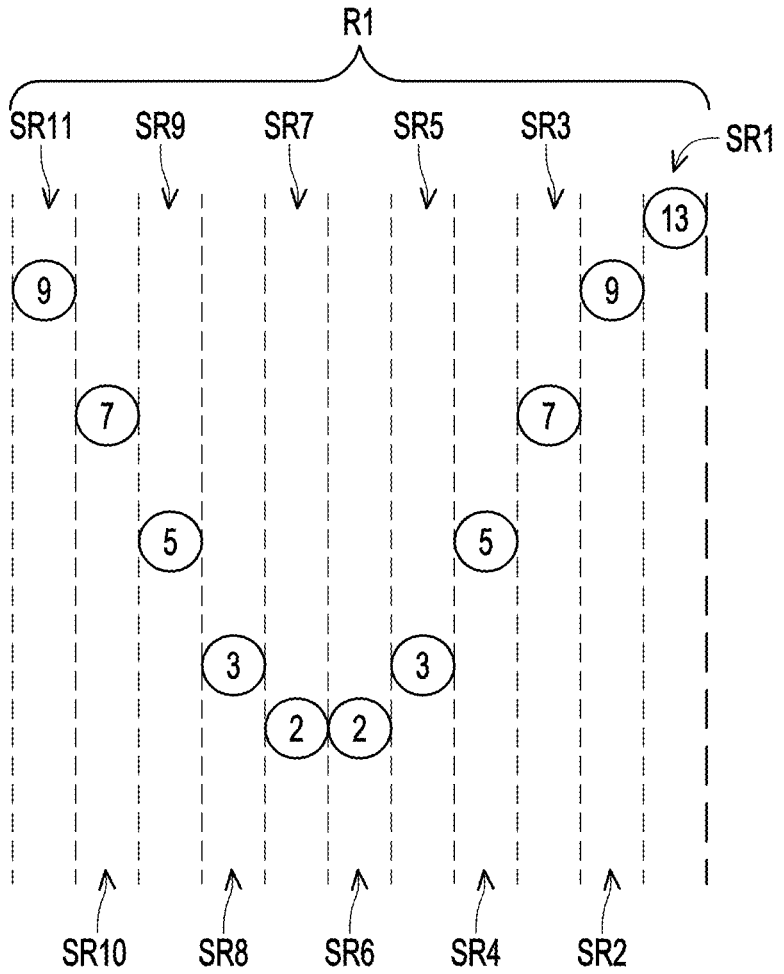
FIGS. 4A and 4B are schematic diagrams illustrating an operation of another example of the read voltage setting method according to an embodiment of the disclosure.
Figure 4B:
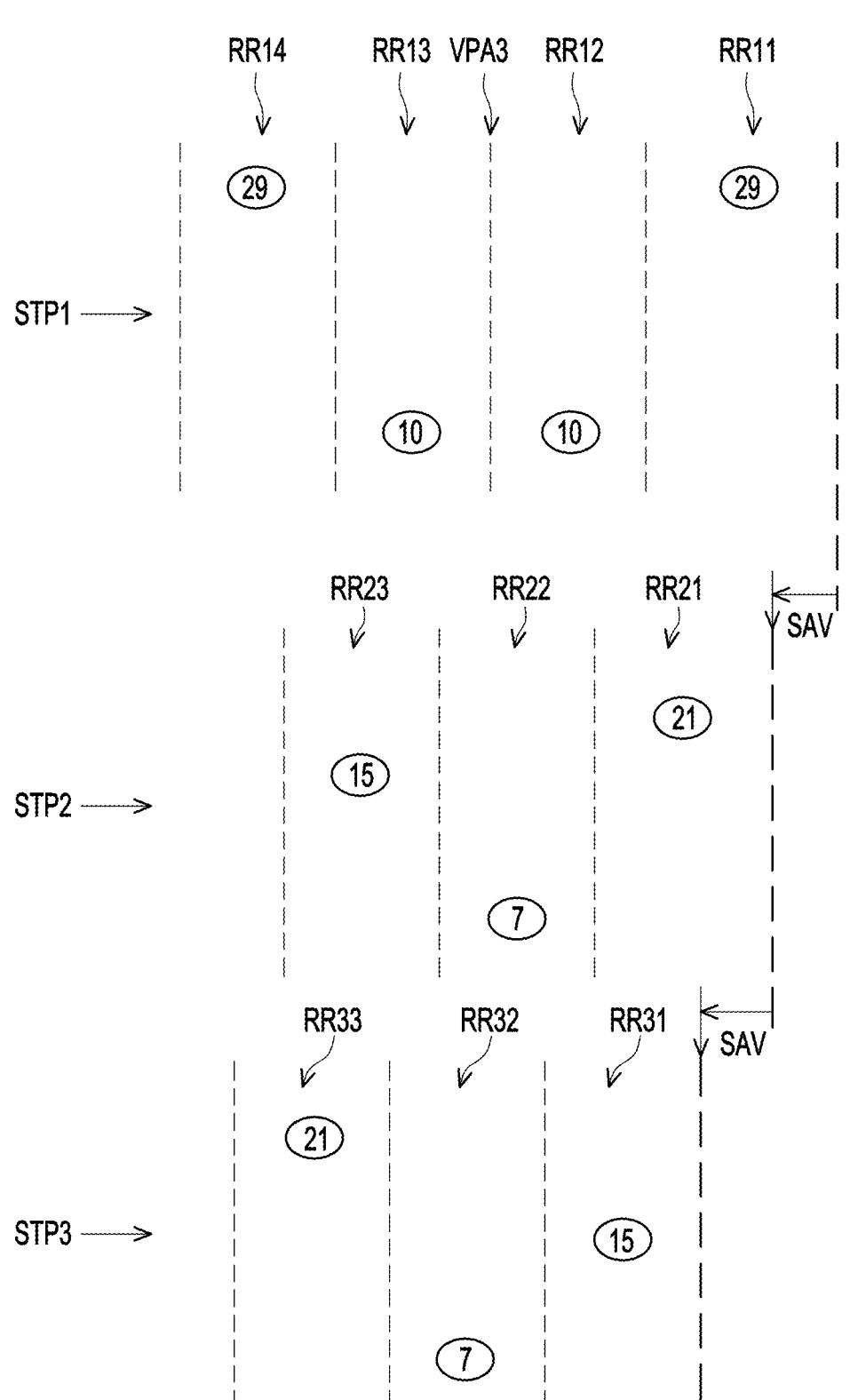

Referring to FIGS. 4A and 4B, FIGS. 4A and 4B are schematic diagrams illustrating an operation of another example of the read voltage setting method according to another embodiment of the disclosure. The vertical axis of FIG. 4A represents the number of memory cells, and the horizontal axis of FIG. 2A represents the voltage. In FIG. 4A, the threshold voltage range R1 may be divided into multiple sub-ranges SR1 to SR11. In the embodiment, the numbers of memory cells corresponding to the respective sub-ranges SR1 to SR11 are respectively 13, 9, 7, 5, 3, 2, 2, 3, 5, 7, 9. In the embodiment, the width of each of the sub-ranges SR1 to SR11 may be equal to one shift voltage value.

Regarding execution of the read voltage setting operation, in FIG. 4B, in the first stage STP1, the controller may set multiple read voltage intervals RR11 to RR14 according to the threshold voltage range R1. The read voltage intervals RR11 to RR14 are arranged successively and sequentially.

In the embodiment, the predetermined with of each of the read voltage intervals RR11 to RR14 may be N times of the shift voltage value, N being an integer greater than 1. In other words, the width of each of the read voltage intervals RR11 to RR14 is greater than the width of each of the sub-ranges SR1 to SR11 shown in FIG. 3B.

In the first stage STP1, the controller may be used with the sensing circuit to perform the read verify operations on the memory cells and respectively obtain the pass memory cell numbers corresponding to the read voltage intervals RR11 to RR14. Specifically, the pass memory cell number of the read voltage interval RR11 may be 29, for example, the pass memory cell number of the read voltage interval RR12 may be 10, for example, the pass memory cell number of the read voltage interval RR13 may be 10, for example, and the pass memory cell number of the read voltage interval RR14 may be 29, for example. Among the numbers, the pass memory cell numbers (equal to 10) corresponding to the read voltage intervals RR12 and RR13 are the minimum value.

In the embodiment, the minimum value (equal to 10) is present in consecutive read voltage intervals RR12 and RR13. Therefore, at the time of setting the read voltage according to the search result of the first stage STP1, the median of the read voltage intervals R12 and R13 may be set as the read voltage. That is, the read voltage may be a voltage VPA3.

Then, in the second stage STP2, the controller may shift the read voltage intervals RR11 to RR14 by the shift voltage value SAV and correspondingly generate the read voltage intervals RR21 to RR23. Then, the controller may be used with the sensing circuit to perform read verify operations on the memory cells according to the read voltage intervals RR21 to RR23.

In the second stage STP2, the controller may be used with the sensing circuit to perform the read verify operations on the memory cells and respectively obtain the pass memory cell numbers corresponding to the read voltage intervals RR21 to RR23. Specifically, the pass memory cell number of the read voltage interval RR21 may be 21, for example, the pass memory cell number of the read voltage interval RR22 may be 7, for example, and the pass memory cell number of the read voltage interval RR23 may be 15, for example. Among the numbers, the pass memory cell number (equal to 7) corresponding to the read voltage interval RR22 is the minimum value.

Then, in the third stage STP3, the controller may shift the read voltage intervals RR21 to RR23 by the shift voltage value SAV and correspondingly generate read voltage intervals RR31 to RR33. Then, the controller may be used with the sensing circuit to perform read verify operations on the memory cells according to the read voltage intervals RR31 to RR33.

In the third stage STP3, the controller may be used with the sensing circuit to perform the read verify operations on the memory cells and respectively obtain the pass memory cell numbers corresponding to the read voltage intervals RR31 and RR32. Specifically, the pass memory cell number of the read voltage interval RR31 may be 15, for example, the pass memory cell number of the read voltage interval RR32 may be 7, for example, and the pass memory cell number of the read voltage interval RR33 may be 21, for example. Among the numbers, the pass memory cell number (equal to 7) corresponding to the read voltage interval RR33 is the minimum value.

Considering the valley search operations of the three stages STP1 to STP3 together, a plurality of consecutive equal number of passing memory cell numbers (=10) appear in the step STP1. In the consideration for symmetry of distribution of memory cell numbers, a medium of the read voltage intervals of the consecutive equal number of the passing memory cell numbers should be a position of the valley. In presented embodiment, although the minimum value (=7) of the passing memory cells numbers obtained in the step STP2 and STP3 is smaller than the minimum value (=10) of the passing memory cells numbers obtained in the step STP1, the controller still sets the read voltage according to the median of the read voltage intervals RR12 and RR13, i.e., the read voltage=VPA3.

In presented invention, after each of the steps STP1-STP3 has been executed, not only the read voltage and the minimum value of the pass cell numbers of final selected valley are recorded, but also whether the valley is found by a position of the consecutive equal number of the passing memory cells numbers is recorded. In each of the steps STP2, STP3 after the step STP1, when valley positions of the steps STP2, STP3 are founded, the valley positions may be compared with the valley positions recorded in previous steps STP1, SPT2, and the valley position can be selected.

In detail, in a situation 1: if two valley positions are founded in different steps which are founded by consecutive equal numbers of passing memory cells numbers, a minimum value of the two consecutive equal numbers may be selected to be the selected valley position. If the two consecutive equal numbers are equaled, any one of the two consecutive equal numbers may be selected to be the selected valley position. In a situation 2: if only one valley position is founded by consecutive equal numbers of the passing memory cells numbers, this valley position is the selected valley position. In a situation 3: if all passing memory cells numbers are not consecutive equal numbers of the passing memory cells numbers, a minimum value of the passing memory cells numbers may be selected to be the selected valley position. If there are a plurality of minimum values of the passing memory cells numbers are equaled, any one of the minimum values of the passing memory cells numbers may be selected to be the selected valley position.

In another embodiment of present invention, another different strategy can be adopted. For example, in a situation 1: if two valley positions are founded in different steps which are founded by consecutive equal numbers of passing memory cells numbers, a valley position of the consecutive equal number of currently step may be selected to be the selected valley position. In situation 2, if only one valley position is founded by consecutive equal numbers of the passing memory cells numbers, this valley position is the selected valley position. In a situation 3, if all passing memory cells numbers are not consecutive equal numbers of the passing memory cells numbers, a minimum value of the passing memory cells numbers may be selected to be the selected valley position. If there are a plurality of minimum values of the passing memory cells numbers are equaled, a valley position searched by currently step may be selected to be the selected valley position.

Referring to FIG. 5, FIG. 5 is a flowchart illustrating a read voltage setting method according to another embodiment of the disclosure. The read voltage setting method is also configured to perform an operation for searching for a valley position according to a threshold voltage distribution curve of multiple memory cells in a memory device, and perform a read voltage setting operation according to the valley region that is found. The memory device may be a non-volatile memory device, such as an NAND or NOR flash memory device.

The read voltage setting method according to the embodiment may be performed by a controller in the memory device. In Step S510, in a threshold voltage range on which the search operation is to be performed, the controller may set multiple first read voltage intervals consecutively distributed in the threshold voltage range to be searched. In Step S520, the controller may be used with a sensing circuit in the memory device, perform read verify operations on memory cells according to the first read voltage intervals, and obtain multiple first pass memory cell numbers respectively corresponding to the first read voltage intervals through the read verify operations.

Then, in Step S530, the controller may determine a minimum value among the first pass memory cell numbers, and sets a selected read voltage interval according to the first read voltage interval corresponding to the minimum value among the first pass memory cell numbers. The selected read voltage interval includes a read voltage of the first read voltage interval (that is the medium of the first read voltage interval). In Step S540, the controller may set multiple second read voltage intervals according to a shift voltage value for the selected read voltage interval. The width of each second read voltage interval is equal to the shift voltage value. Here, the width of the second read voltage interval refers to the difference between the upper limit voltage and the lower limit voltage in the second read voltage interval.

In Step S550, the controller may perform read verify operations on the memory cells according to the second read voltage interval and obtain multiple second pass memory cell numbers respectively corresponding to the second read voltage intervals. In Step S560, the controller may set the read voltage according to the second read voltage interval corresponding to the minimum value among the second pass memory cell numbers.

Figure 6A:
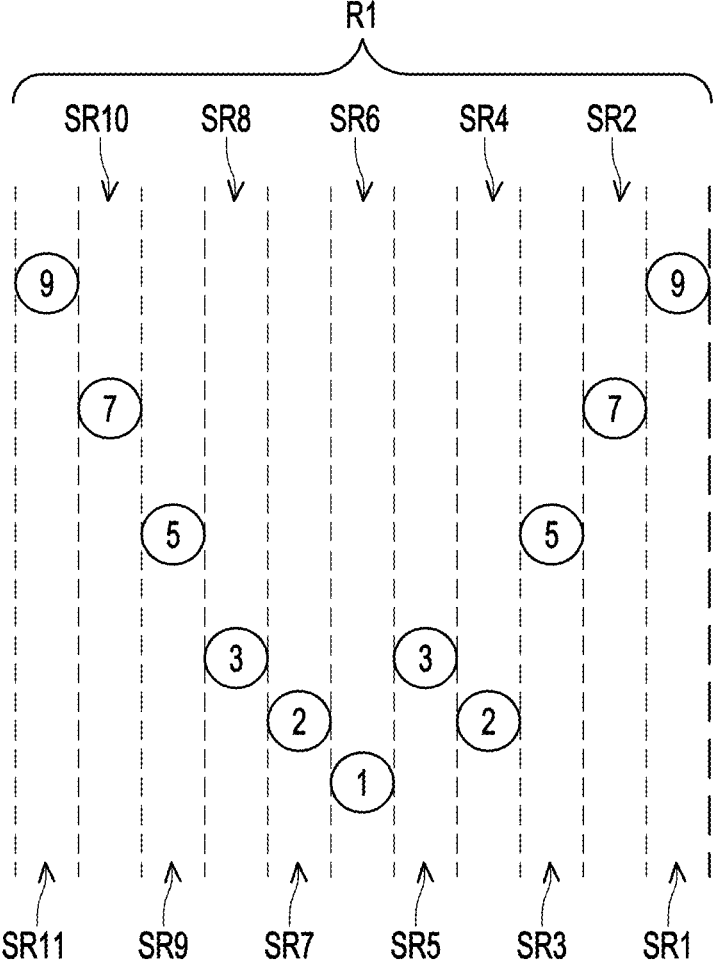
FIGS. 6A and 6B are schematic diagrams illustrating an example of a read voltage setting operation according to another embodiment of the disclosure.
Figure 6B:
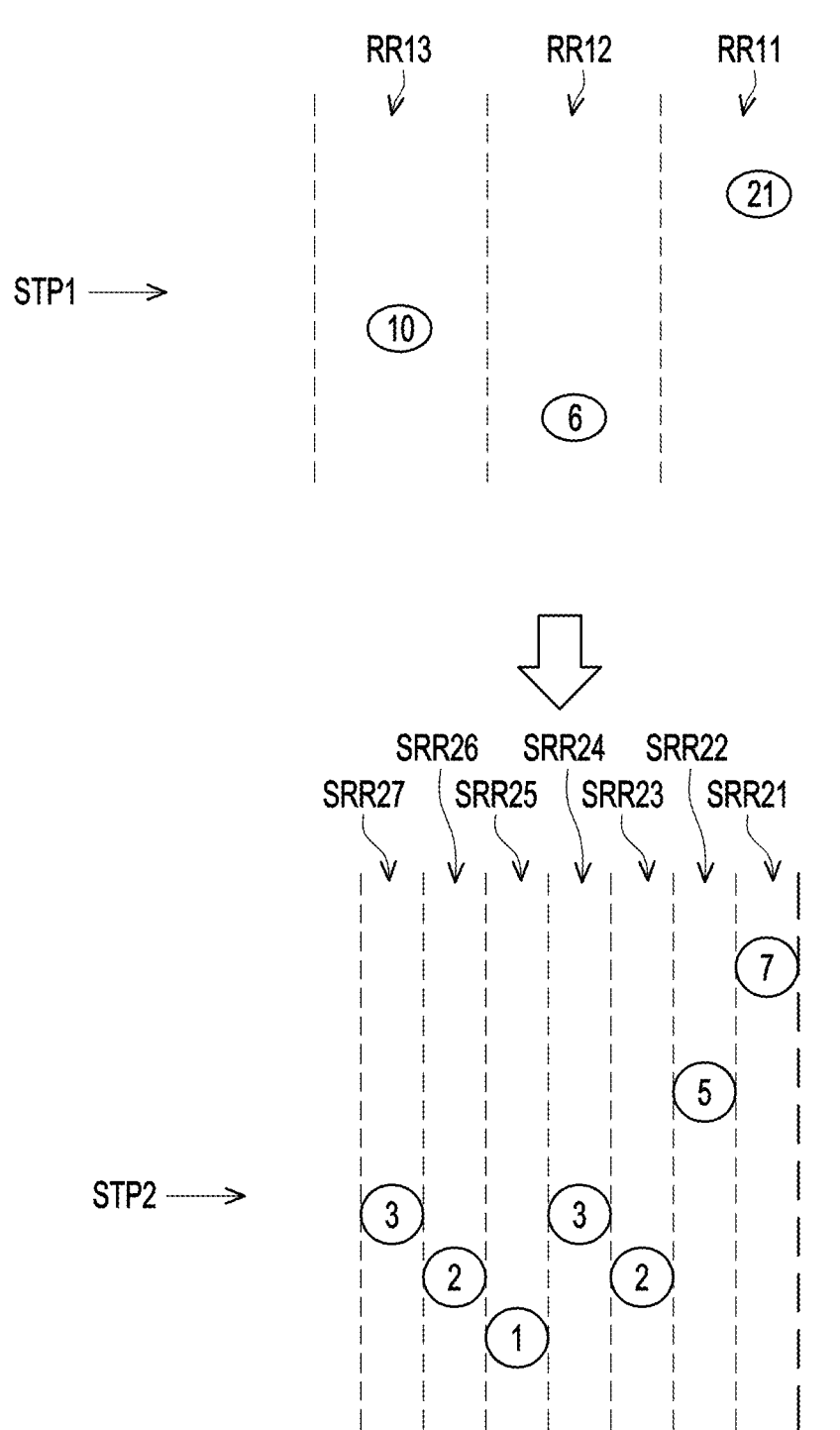

Regarding operational details of the read voltage setting method of FIG. 5, FIGS. 6A and 6B are schematic diagrams illustrating an example of a read voltage setting operation according to another embodiment of the disclosure. The vertical axis of FIG. 6A represents the number of memory cells, and the horizontal axis of FIG. 2A represents the voltage. In FIG. 6A, the threshold voltage range R1 may be divided into multiple sub-ranges SR1 to SR11. In the embodiment, the numbers of memory cells corresponding to the respective sub-ranges SR1 to SR11 are respectively 9, 7, 5, 2, 3, 1, 2, 3, 5, 7, 9. In the embodiment, the width of each of the sub-ranges SR1 to SR11 may be equal to one shift voltage value.

Regarding execution of the read voltage setting operation, in FIG. 6B, in the first stage STP1, the controller may set multiple read voltage intervals RR11 to RR13 according to the threshold voltage range R1. The read voltage intervals RR11 to RR13 are arranged successively and consecutively.

In the read verify operations of the stage STP1, the pass memory cell number corresponding to the read voltage interval RR11 may be 21, for example, the pass memory cell number corresponding to the read voltage interval RR12 may be 6, for example, and the pass memory cell number corresponding to the read voltage interval RR13 may be 10, for example. The minimum value among the pass memory cell numbers is 6, corresponding to the read voltage interval RR12. Therefore, the controller may set a selected read voltage interval SSR according to the read voltage interval RR12. The read voltage interval SSR may include the read voltage interval RR12, and the width of the selected read voltage interval SSR may be greater than the width of the read voltage interval RR12.

According to the valley search result of the first stage STP1, the controller may set the read voltage according to the read voltage interval RR12 corresponding to the minimum value among the pass memory cell numbers. The read voltage may be equal to ½ of the sum of the upper limit and the lower limit of the read voltage interval RR12.

According to the read verify operations in the stage STP1, the controller may, in the stage STP2, further set multiple relatively small read voltage intervals SRR21 to SRR27 by dividing the selected read voltage interval (the read voltage interval RR12) according to a shift voltage value. The shift voltage value may be smaller than the width of the read voltage interval RR12. In addition, the read voltage intervals SRR21 to SRR27 may be consecutively distributed in the selected read voltage interval SSR. Wherein, width of each of the read voltage intervals SRR21 to SRR27 is smaller than a width of the read voltage interval RR12.

In the embodiment, the width of the read voltage interval RR12 may be equal to three shift voltage values, and the selected read voltage interval SSR may have 7 shift voltage values, for example. The width of each read voltage intervals SRR21 to SRR27 may be equal to one shift voltage value, and the read voltage intervals SRR23 to SRR25 in the selected read voltage interval SSR may be equal to the read voltage interval RR12.

In the stage STP2, the controller may perform fine-grained read verify operations on the memory cells according to the read voltage intervals SRR21 to SRR27 and obtain multiple pass memory cell numbers respectively corresponding to the read voltage intervals SRR21 to SRR27, which are 7, 5, 2, 3, 1, 2, 3. The minimum value among the pass memory cell numbers is 1, corresponding to the read voltage interval SRR25.

In this way, in the stage STP2, the controller may perform the read voltage setting operation according to the median of the read voltage interval SRR25. The read voltage may be equal to ½ of the sum of the upper limit and the lower limit of the read voltage interval SRR25.

Like the above, in the embodiment, the controller may perform a read test operation on the memory block according to the read voltage set in the first stage STP1. If the result of the read test indicates "pass", the controller may omit the second stage STP2. Alternatively, if the result of the read test indicates "fail", the controller may execute the second stage STP2 and further set the correct read voltage.

Figure 7:
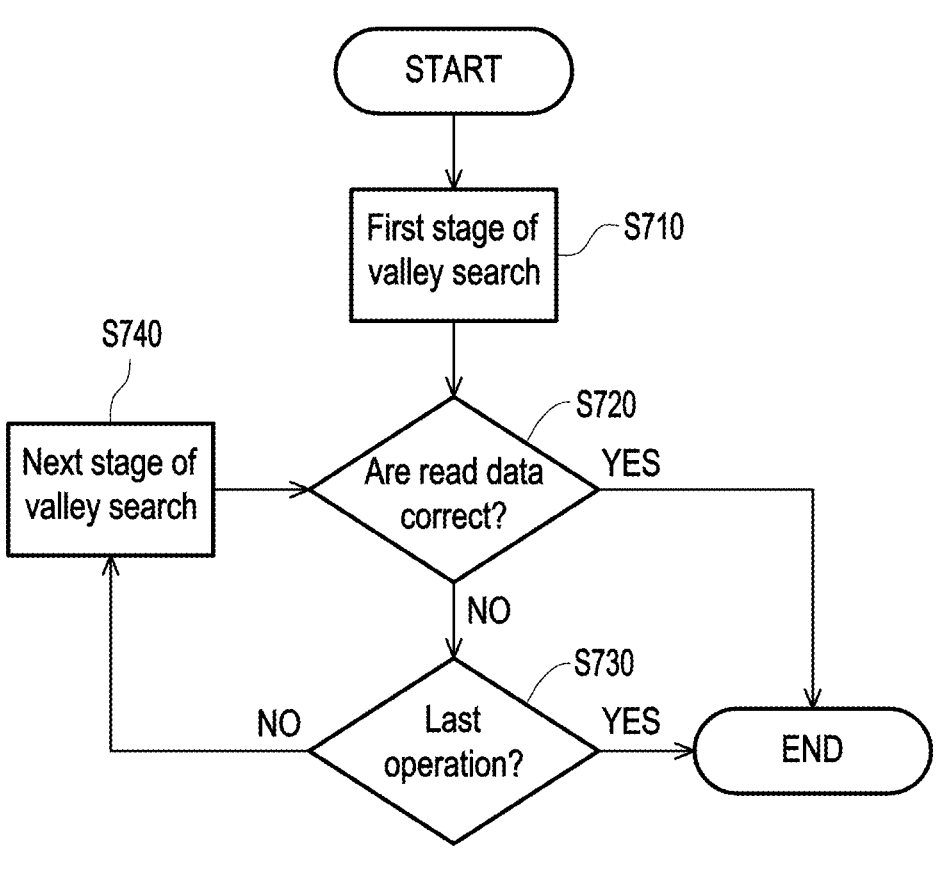
FIG. 7 is a flowchart illustrating a read voltage setting operation according to an embodiment of the disclosure.

Referring to FIG. 7, FIG. 7 is a flowchart illustrating a read voltage setting operation according to an embodiment of the disclosure. In Step S710, the controller of the memory device may perform a first stage of a valley search operation according to a memory cell threshold voltage distribution range, and set a read voltage according to the first stage of the valley search operation. Then, the controller may perform a read test on a memory block according to a currently set read voltage and, in Step S720, determine whether read data are correct. If the read data are correct, the controller may end the flow. Alternatively, if the read data are incorrect, Step S730 is performed.

In Step S730, the controller may determine whether a current search operation is a last operation. If YES, the controller may end the flow. If a determination result of Step S730 indicates NO, Step S740 may be executed to perform a valley search operation of the next stage. In addition, the read voltage that is set is adjusted according to the valley search operation of the next stage. Then, Step S720 is performed.

At the time of executing the valley search operation according to the embodiment of the disclosure, if the read voltage is not set correctly or the search operation is not yet the last operation, the valley search operation may continue in multiple stages.

In the embodiment, the valley search operation may be performed according to the above embodiments. Details have been set forth above. Therefore, the same description will not be repeated in the following.

Figure 8:
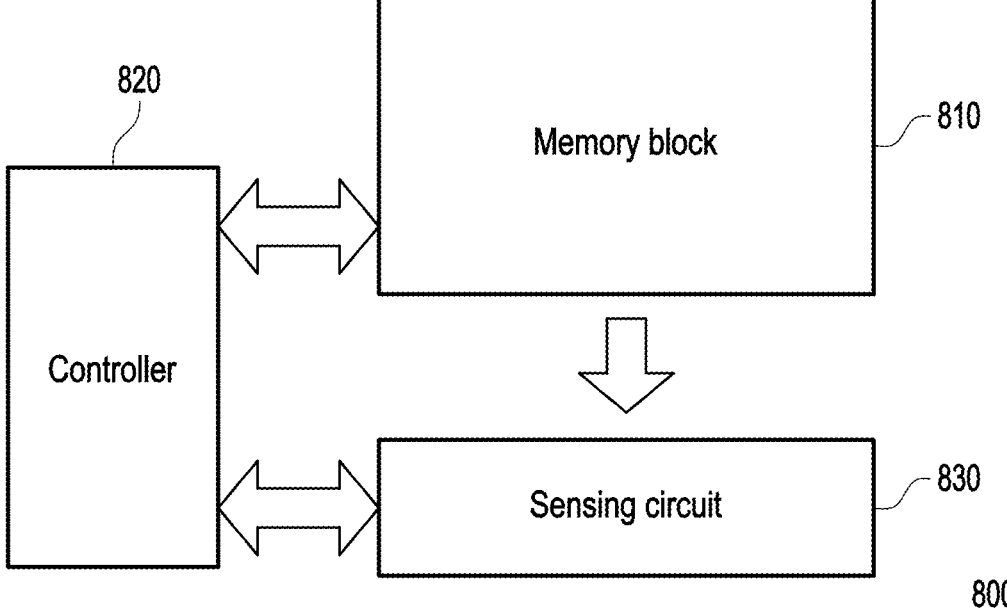
FIG. 8 is a schematic diagram illustrating a memory device according to an embodiment of the disclosure.

Referring to FIG. 8, FIG. 8 is a schematic diagram illustrating a memory device according to an embodiment of the disclosure. A memory device 800 includes a memory block 810, a controller 820, and a sensing circuit 830. In this embodiment, the controller 820 may correspond to one or more memory chips, where each of the memory chips may have the memory block 810 and the sensing circuit 830. The controller 820 may be electrically coupled to the one or more memory chips. The controller 820 may be disposed external from the memory chips individually, or the controller 820 may be disposed in anyone of the memory chips. The memory block 810 is coupled to the controller 820 and the sensing circuit 830. The memory block 810 may be a non-volatile memory block, such as an NAND or NOR flash memory block. The sensing circuit 830 may include a sensing amplifier and be configured to perform a read data sensing operation of the memory block 810. The controller 820 may be equipped with the sensing circuit 830 to perform the read voltage setting operation according to the embodiments of the disclosure.

Herein, the controller 820 may firstly send a first instruction for valley searching position (such as the Step S710 in FIG. 7), and a memory chip may execute the first step STP1 mentioned in above embodiments according to the first instruction, and read data according to found valley voltage. After the memory chip have finished reading the data, the controller 820 may confirm whether the data is correct or not according to readout data from the memory chip (such as the Step S720 in FIG. 7). If the readout data in confirmed to be correct, the valley searching operation may be finished, and if the readout data in confirmed to be incorrect, whether this operation is a last operation may be confirmed (such as the Step S730 in FIG. 7). If this operation is the last operation, the controller 820 may finish the valley search operation. If this operation is not the last operation, the controller 820 may further send another instruction (such as the Step S740 in FIG. 7), and the memory chip may execute another step (the second step STP2 mentioned in above embodiments) according to the instruction to obtain a valley position, and further set the read voltage according to the valley position. In some embodiments, a new valley position may be obtained by comparing the searched valleys mentioned above to determine a new valley position, and set the read voltage according to the new valley position.

Operational details of the controller 820 have been described in detail above and therefore will not be repeated in the following.

The controller 820 may be a processor equipped with computational capability. Or, the controller 820 may be a hardware circuit implemented as a field programmable gate array (FPGA), a complex programmable logic device (CPLD), or an application-specific integrated circuit (ASIC) by means of the hardware description language (HDL) or any other digital circuit design means well-known by people having ordinary skills in the art.

Based on the above, according to the embodiments of the disclosure, the valley of the memory cell threshold voltage distribution curve is looked for by multiple stages. In addition to reducing the time required for the search operation, the read voltage setting method according to the embodiments may avoid the phenomenon of reading erroneous data caused by the found valley being the minimum value of the region. Thus, the read performance of the memory device is facilitated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A read voltage setting method, comprising:
setting a plurality of first read voltage intervals;
performing read verify operations on a plurality of memory cells according to the plurality of first read voltage intervals, and obtaining first pass memory cell numbers respectively corresponding to the plurality of first read voltage intervals;
shifting each of the plurality of first read voltage intervals by a shift voltage value to obtain a plurality of second read voltage intervals, wherein the shift voltage value is smaller than a width of each of the plurality of first read voltage intervals;
performing the read verify operations on the plurality of memory cells according to the plurality of second read voltage intervals, and obtaining second pass memory cell numbers respectively corresponding to the plurality of second read voltage intervals; and determining whether there is at least one consecutive equal number, or a minimum value among the first pass memory cell numbers and the second pass memory cell numbers and setting a read voltage according to each of the plurality of first read voltage intervals and each of the plurality of second read voltage intervals corresponding to at least one consecutive equal number or the minimum value.

2. The read voltage setting method as claimed in claim 1, further comprising:

setting a voltage value of the read voltage according to a median of the at least one of the plurality of first read voltage intervals and the plurality of second read voltage intervals corresponding to the minimum value of the first pass memory cell numbers and the second pass memory cell numbers; or when there is at least one consecutive equal number among the first pass memory cell numbers or the second pass memory cell numbers, setting a medium of the plurality of first read voltage intervals or the plurality of second read voltage intervals corresponding to a minimum value of the at least one consecutive equal number to be the voltage value of the read voltage.

3. The read voltage setting method as claimed in claim 1, wherein the width of each of the plurality of first read voltage intervals is N times of the shift voltage value, N being an integer greater than 1.

4. The read voltage setting method as claimed in claim 3, wherein setting the plurality of first read voltage intervals comprises:

setting a first start read voltage, obtaining a first end read voltage by subtracting N times of the shift voltage value from the first start read voltage, and setting a first stage in the plurality of first read voltage intervals according to the first start read voltage and the first end read voltage; and setting the first end read voltage to be equal to a second start read voltage, obtaining a second end read voltage by subtracting N times of the shift voltage value from the second start read voltage, and setting a second stage in the plurality of first read voltage intervals according to the second start read voltage and the second end read voltage.

5. The read voltage setting method as claimed in claim 4, wherein setting the plurality of first read voltage intervals further comprises:

setting the second end read voltage to be equal to a third start read voltage, obtaining a third end read voltage by subtracting N times of the shift voltage value from the third start read voltage, and setting a third stage in the plurality of first read voltage intervals according to the third start read voltage and the third end read voltage.

6. The read voltage setting method as claimed in claim 1, further comprising:

shifting each of the plurality of second read voltage intervals by the shift voltage value to obtain a plurality of third read voltage intervals;

performing the read verify operations on the memory cells according to the plurality of third read voltage intervals, and obtaining third pass memory cell numbers respectively corresponding to the plurality of third read voltage intervals; and determining a minimum value among the first pass memory cell numbers, the second pass memory cell numbers and the third pass memory cell numbers, or determining whether there is at least one consecutive equal number among the first pass memory cell numbers, the second pass memory cell numbers and the third pass memory cell numbers; and setting the read voltage according to at least one of the plurality of first read voltage intervals, the plurality of second read voltage intervals, or the plurality of third read voltage intervals corresponding to the minimum value or the at least one consecutive number.

7. The read voltage setting method as claimed in claim 5, further comprising:

setting a voltage value of the read voltage according to a median of the at least one of the plurality of first read voltage intervals, the plurality of second read voltage intervals, and the plurality of third read voltage intervals corresponding to the minimum value; or when there is the at least one consecutive equal number among the first pass cell numbers, the second pass cell numbers and the third pass cell numbers, setting the voltage value of the read voltage according to median of at least one the plurality of first read voltage intervals, the plurality of second read voltage intervals, and the plurality of third read voltage intervals corresponding to a minimum value of the at least one consecutive equal number.

8. A read voltage setting method, comprising:

setting a plurality of first read voltage intervals;

performing read verify operations on a plurality of memory cells according to the plurality of first read voltage intervals, and obtaining first pass memory cell numbers respectively corresponding to the plurality of first read voltage intervals;

determining a minimum value among the first pass memory cell numbers, and setting a selected read voltage interval according to each of the plurality of first read voltage intervals corresponding to the minimum value;

setting a plurality of second read voltage intervals according to a shift voltage value for the selected read voltage interval;

performing the read verify operations on the memory cells according to the plurality of second read voltage intervals, and obtaining second pass memory cell numbers respectively corresponding to the plurality of second read voltage intervals; and setting a read voltage according to a second read voltage interval of the plurality of second read voltage intervals which corresponding to a minimum value among the second pass memory cell numbers.

9. The read voltage setting method as claimed in claim 8, wherein step of setting the read voltage according to the plurality of second read voltage intervals corresponding to the minimum value among the second pass memory cell numbers comprises:

setting, as a voltage value of the read voltage, a median of the second read voltage interval corresponding to the minimum value among the second pass memory cell numbers.

10. The read voltage setting method as claimed in claim 8, wherein a width of each of the plurality of first read voltage intervals larger than a width of each of the plurality of second read voltage intervals.

11. The read voltage setting method as claimed in claim 10, wherein step of setting the plurality of second read voltage intervals according to the shift voltage value for the selected read voltage interval comprises:

dividing the selected read voltage interval to the plurality of second read voltage intervals according to the shift voltage.

12. The read voltage setting method as claimed in claim 9, wherein setting the plurality of first read voltage intervals comprises:

setting a first start read voltage, obtaining a first end read voltage by subtracting N times of the shift voltage value from the first start read voltage, and setting a first stage in the plurality of first read voltage intervals according to the first start read voltage and the first end read voltage; and setting the first end read voltage to be equal to a second start read voltage, obtaining a second end read voltage by subtracting N times of the shift voltage value from the second start read voltage, and setting a second stage in the plurality of first read voltage intervals according to the second start read voltage and the second end read voltage.

13. The read voltage setting method as claimed in claim 12, wherein setting the plurality of first read voltage intervals further comprises:

setting the second end read voltage to be equal to a third start read voltage, obtaining a third end read voltage by subtracting N times of the shift voltage value from the third start read voltage, and setting a third stage in the plurality of first read voltage intervals according to the third start read voltage and the third end read voltage.

14. A memory device, comprising:

a memory block, having a plurality of memory cells;

a sensing circuit, coupled to the plurality of memory cells and performing a data read operation on the plurality of memory cells; and a controller, coupled to the sensing circuit and the memory block, and configured to:

set a plurality of first read voltage intervals;

perform read verify operations on the plurality of memory cells according to the plurality of first read voltage intervals, and obtain first pass memory cell numbers respectively corresponding to the plurality of first read voltage intervals;

shift each of the plurality of first read voltage intervals by a shift voltage value to obtain a plurality of second read voltage intervals, wherein the shift voltage value is smaller than a width of each of the plurality of first read voltage intervals;

perform the read verify operations on the plurality of memory cells according to the plurality of second read voltage intervals, and obtain second pass memory cell numbers respectively corresponding to the plurality of second read voltage intervals; and determining whether there is at least one consecutive equal number, or a minimum value among the first pass memory cell numbers and the second pass memory cell numbers and setting a read voltage according to each of the plurality of first read voltage intervals and each of the plurality of second read voltage intervals corresponding to at least one consecutive equal number or the minimum value.

15. The memory device as claimed in claim 14, wherein the controller sets a voltage value of the read voltage according to a median of the at least one of the plurality of first read voltage intervals and the plurality of second read voltage intervals corresponding to the minimum value of the first pass memory cell numbers and the second pass memory cell numbers, or when there is at least one consecutive equal number among the first pass memory cell numbers or the second pass memory cell numbers, setting a medium of the at least one consecutive equal number to be the voltage value of the read voltage.

16. The memory device as claimed in claim 14, wherein the width of each of the plurality of first read voltage intervals is N times of the shift voltage value, N being an integer greater than 1.

17. A memory device, comprising:

a memory block, having a plurality of memory cells;

a sensing circuit, coupled to the plurality of memory cells and performing a data read operation on the plurality of memory cells; and a controller, coupled to the sensing circuit and the memory block, and configured to:

set a plurality of first read voltage intervals;

perform read verify operations on the plurality of memory cells according to the plurality of first read voltage intervals, and obtain first pass memory cell numbers respectively corresponding to the plurality of first read voltage intervals;

determine a minimum value among the first pass memory cell numbers, and setting a select read voltage interval according to each of the plurality of first read voltage intervals corresponding to the minimum value;

set a plurality of second read voltage intervals according to a shift voltage value for the selected read voltage interval;

perform the read verify operations on the plurality of memory cells according to the plurality of second read voltage intervals, and obtain second pass memory cell numbers respectively corresponding to the plurality of second read voltage intervals; and set a read voltage according to a second read voltage interval of the plurality of second read voltage intervals corresponding to a minimum value among the second pass memory cell numbers.

18. The memory device as claimed in claim 17, wherein a distribution range of the plurality of second read voltage intervals is greater than a distribution range of the selected read voltage interval.

19. The memory device as claimed in claim 17, wherein the controller sets, as the voltage value of the read voltage, a median of the second read voltage interval of the plurality of second read voltage intervals corresponding to the minimum value among the second pass memory cell numbers.

20. The memory device as claimed in claim 17, wherein a width of each of the plurality of first read voltage intervals is larger than a width of each of the plurality of second read voltage intervals.

* * * * *